US009520457B2

(12) United States Patent
So et al.

(10) Patent No.: US 9,520,457 B2
(45) Date of Patent: Dec. 13, 2016

(54) DISPLAY PANEL AND REPAIRING METHOD THEREOF

(71) Applicant: Samsung Display Co., Ltd., Yongin, Gyeonggi-Do (KR)

(72) Inventors: Dong-Yoon So, Asan-si (KR); Kyong Tae Park, Suwon-si (KR); Mi Jin Yoon, Daegu (KR); Sung Ho Cho, Seoul (KR); Yu-Hyun Cho, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/731,814

(22) Filed: Jun. 5, 2015

(65) Prior Publication Data

US 2016/0204181 A1    Jul. 14, 2016

(30) Foreign Application Priority Data

Jan. 13, 2015  (KR) .......................... 10-2015-0006143

(51) Int. Cl.

| H01L 27/32 | (2006.01) |
| G02F 1/1362 | (2006.01) |
| H01L 51/56 | (2006.01) |
| H01L 51/52 | (2006.01) |
| H01L 51/00 | (2006.01) |

(52) U.S. Cl.
CPC ..... *H01L 27/3276* (2013.01); *G02F 1/136259* (2013.01); *H01L 27/3211* (2013.01); *H01L 27/3223* (2013.01); *H01L 27/3262* (2013.01); *H01L 51/5237* (2013.01); *H01L 51/56* (2013.01); *H01L 51/0031* (2013.01); *H01L 2251/568* (2013.01)

(58) Field of Classification Search
None
See application file for complete search history.

(56) References Cited

U.S. PATENT DOCUMENTS 6,943,374 B1 * 9/2005 Park ...................... G02F 1/1309
257/347
8,345,211 B2    1/2013 Ozeki et al.
(Continued)

FOREIGN PATENT DOCUMENTS

KR    10-2008-0022357 A    3/2008
KR    10-2009-0072393 A    7/2009
(Continued)

*Primary Examiner* — Joseph Schoenholtz
(74) *Attorney, Agent, or Firm* — Knobbe Martens Olson & Bear LLP

(57) ABSTRACT

A display panel and a repairing method thereof are disclosed. In one aspect, the display panel includes an active area including a plurality of pixels and a plurality of signal lines. The panel also includes a repair line at least partially surrounding the active area and overlapping the signal line in the active area and a plurality of first transistors formed on a side of the active area, wherein one end of each of the first transistors overlaps the repair line. The panel further includes a sealing portion configured to seal the active area, the repair line, and the first transistors. The panel also includes a pad portion formed outside the sealing portion and including a plurality of dummy pads respectively connected to the first transistors and a plurality of driving pads respectively connected to the signal lines.

20 Claims, 5 Drawing Sheets

(56) References Cited

U.S. PATENT DOCUMENTS

| 9,286,832 B2* | 3/2016 | Park ..................... G09G 3/3291 |
| 2005/0195338 A1* | 9/2005 | Matsumoto ....... G02F 1/136204 |
| | | 349/40 |
| 2007/0063951 A1 | 3/2007 | Lin et al. |
| 2009/0167976 A1* | 7/2009 | Chung .............. G02F 1/136259 |
| | | 349/54 |

FOREIGN PATENT DOCUMENTS

| KR | 10-2010-0065745 A | 6/2010 |
| KR | 10-2012-0077508 A | 7/2012 |
| KR | 10-2015-0021773 A | 3/2015 |
| KR | 10-2015-0044328 A | 4/2015 |

\* cited by examiner

DISPLAY PANEL AND REPAIRING METHOD THEREOF

INCORPORATION BY REFERENCE TO ANY PRIORITY APPLICATIONS

This application claims priority to and the benefit of Korean Patent Application No. 10-2015-0006143 filed in the Korean Intellectual Property Office on Jan. 13, 2015, the entire contents of which are incorporated herein by reference.

BACKGROUND

1. Field

The described technology generally relates to a display panel and a repairing method thereof.

2. Description of the Related Technology

The luminance of an organic light-emitting diode (OLED) display is controlled by a current or a voltage. Since OLED technology is suitable for high contrast and rapid response, it has been applied in many commercial applications such as mobile phones, smartphones, laptop computers, digital broadcasting terminals, personal digital assistants (PDAs), portable multimedia players (PMPs), navigation systems, slate PCs, tablet PCs, ultrabooks, wearable devices, digital TVs, desktop computers, digital signing systems, and the like.

Signal wirings or signal lines such as data lines and scan lines and pixels connected to the corresponding signal wirings are formed on a display panel. Each of the scan lines and the data lines is formed to have a very small size, such as a width of a micrometer or less.

SUMMARY OF CERTAIN INVENTIVE ASPECTS

One inventive aspect relates to a display panel and a repairing method thereof easily repairs a data line when the data line is disconnected.

Another aspect is a display panel including: an active area in which a plurality of pixels and a plurality of signal lines are formed; a repair wiring formed around the active area and overlapping with the signal line around the active area; a plurality of first transistors formed around the active area and of which one end overlaps with the repair wiring; a sealing part configured to seal the active area, the repair wiring, and the plurality of first transistors; a pad part formed outside the sealing part and including a plurality of dummy pads connected to a corresponding first transistor among the plurality of first transistors and a plurality of driving pads connected with the signal lines; and a plurality of test signal lines connected with the corresponding pads among the plurality of dummy pads and the plurality of driving pads and transferring test signals.

A signal line with a defect among the plurality of signal lines can be connected with the overlapping repair wiring.

According to a kind of test signal supplied to the signal line with the defect, the plurality of first transistors can be selectively connected with the repair wiring.

A peripheral point of a defect point in which the defect is generated can be cut.

The display panel can further include a plurality of second transistors of which one end is connected to a corresponding dummy pad among the plurality of dummy pads, the other end is connected to a corresponding test signal line, and a gate is connected to the first transistor and a test starting signal line to which a test starting signal is supplied outside the sealing part.

In at least one of the plurality of first transistors, one end can be connected with the repair wiring, and according to a kind of test signal supplied to the signal line with the defect, a first transistor to which the one end is connected can be isolated from the repair wiring.

The display panel can further include a repair pad formed outside the sealing part and connected with the repair wiring; and a second transistor of which one end is connected to the repair pad, the other end overlaps with the plurality of test signal lines, and a gate is connected to the test starting signal line to which the test starting signal is supplied outside the sealing part.

According to a kind of test signal supplied to the signal line with the defect, the corresponding test signal line and the other end of the second transistor can be connected to each other.

Another aspect is a repairing method of a display panel including an active area in which a plurality of pixels and a plurality of signal lines are formed, a repair wiring formed around the active area and overlapping with the signal line around the active area, a plurality of first transistors formed around the active area and of which one end overlaps with the repair wiring, a sealing part configured to seal the active area, the repair wiring, and the plurality of first transistor, a pad part formed outside the sealing part and including a plurality of dummy pads connected to a corresponding first transistor among the plurality of first transistors and a plurality of driving pads connected with the signal lines, and a plurality of test signal lines connected with the corresponding pads among the plurality of dummy pads and the plurality of driving pads and transferring test signals, the method including: cutting a peripheral point of a point where a defect of the signal line is generated; connecting the repair wiring overlapping the signal line with the defect among the plurality of signal lines; and connecting the repair wiring by selecting the plurality of first transistors according to a kind of test signal supplied to the signal line with the defect.

The display panel can further include a plurality of second transistors of which one end is connected to a corresponding dummy pad among the plurality of dummy pads, the other end is connected to a corresponding test signal line, and a gate is connected to the first transistor and a test starting signal line to which a test starting signal is supplied outside the sealing part, and the repairing method can further include supplying the test starting signal to a disable level when the first transistor and the repair wiring are connected to each other.

Another aspect is a display panel, comprising: an active area including a plurality of pixels and a plurality of signal lines; a repair line at least partially surrounding the active area and overlapping the signal line in the active area; a plurality of first transistors formed on a side of the active area, wherein one end of each of the first transistors overlaps the repair line; a sealing portion configured to seal the active area, the repair line, and the first transistors; a pad portion formed outside the sealing portion and including i) a plurality of dummy pads respectively connected to the first transistors and ii) a plurality of driving pads respectively connected to the signal lines; and a plurality of test signal lines connected to the corresponding dummy and driving pads and configured to provide test signals from the dummy pads and the driving pads to the pixels.

In the above display panel, a defective one of the signal lines is electrically connected to the overlapping repair line.

In the above display panel, each of the first transistors is selectively connected to the repair line based on a type of test signal provided to the defective signal line.

In the above display panel, the defective signal line includes a defect point and a peripheral point adjacent to the defect point, wherein the peripheral point is configured to be cut.

The above display panel further comprises a plurality of second transistors each including a first end electrically connected to the corresponding dummy pad, a second end electrically connected to a corresponding test signal line, and a gate electrically connected to the first transistors and a test starting signal line configured to receive a test starting signal from outside the sealing portion.

In the above display panel, a first one of the first transistors has an end electrically connected to the repair line, wherein a second one of the first transistors has an end isolated from the repair line based on a type of test signal provided to a defective one of the signal lines.

The above display panel further comprises: a repair pad formed outside the sealing portion and connected to the repair line; and a second transistor including a first end electrically connected to the repair pad, a second end overlapping the test signal lines, and a gate electrically connected to a test starting signal line configured to receive a test starting signal from outside the sealing portion.

In the above display panel, one of the test signal lines and the second end of the corresponding second transistor are electrically connected to each other based on a type of test signal supplied to a defective one of the signal lines.

Another aspect is a method of repairing a display panel, comprising: determining a defective one of a plurality of signal lines, wherein the display panel includes an active area including a plurality of pixels and the signal lines, a repair line at least partially surrounding the active area and overlapping the signal line and the active area, a plurality of first transistors formed on a side of the active area, wherein one end of each of the first transistors overlaps with the repair line; cutting a peripheral point adjacent to a defect point indicative of a defect in the defective signal line; selecting a first transistor of the first transistors based on a type of test signal provided to the defective signal line; and connecting the repair line to the selected first transistor based on the selection.

The above method further comprises supplying a test starting signal at a disable level when the selected first transistor and the repair line are electrically connected to each other, wherein the display panel further includes: a sealing portion configured to seal the active area, the repair line, and the first transistors; a pad portion formed outside the sealing portion and including i) a plurality of dummy pads respectively connected to the first transistors and ii) a plurality of driving pads respectively connected to the signal lines; and a plurality of second transistors having a first end electrically connected to a corresponding dummy pad among the dummy pads, a second end electrically connected to a corresponding test signal line, and a gate electrically connected to the selected first transistor and a test starting signal line to which a test starting signal is supplied from outside the sealing portion.

In the above method, a first one of the first transistors has an end electrically connected to the repair line, wherein a second one of the first transistors has an end isolated from the repair line based on a kind of test signal provided to the defective signal line.

In the above method, the display panel further comprises: a sealing portion configured to seal the active area, the repair line, and the first transistors; a pad portion formed outside the sealing portion and including i) a plurality of dummy pads respectively connected to the first transistors and ii) a plurality of driving pads respectively connected to the signal lines; a plurality of test signal lines connected to the corresponding dummy and driving pads and configured to provide test signals from the dummy pads and the driving pads to the pixels; a repair pad formed outside the sealing portion and connected to the repair line; and a second transistor having a first end electrically connected to the repair pad, a second end overlapping the test signal lines, and a gate electrically connected to a test starting signal line configured to receive a test starting signal from outside the sealing portion.

In the above method, one of the test signal lines and the second end of the corresponding second transistor are electrically connected to each other based on a kind of test signal supplied to the signal line with the defect.

Another aspect is a display panel, comprising: an active area including a plurality of pixels and a plurality of signal lines electrically connected to the pixels; a repair line formed at least partially surrounding the active area and overlapping the signal line in the active area; a plurality of first transistors formed on a side of the active area, wherein one end of each of the first transistors overlaps the repair line at an overlapping point; a sealing portion configured to seal the active area, the repair line, and the first transistors, wherein the sealing portion surrounds the active area; and a pad portion formed outside the sealing portion and including i) a plurality of dummy pads respectively connected to the first transistors and ii) a plurality of driving pads respectively connected to the signal lines; a gate signal line electrically connected to the gates of the first transistors and configured to transmit a test starting signal to the first transistors and a scan signal to the pixels; and a direct current (DC) line electrically connected to the signal lines and configured to transmit a test signal and a data signal to the pixels.

In the above display panel, a defective one of the signal lines is electrically connected to the overlapping repair line.

In the above display panel, the DC line comprises R, G, B lines respectively connected to the corresponding dummy and driving pads, wherein the R, G, B lines are configured to provide the test signal from the dummy and driving pads to the pixels, wherein each of the first transistors is selectively connected to the repair line based on a type of the test signal transmitted to the defective signal line.

In the above display panel, the defective signal line includes a defect point and a peripheral point adjacent to the defect point, and wherein the peripheral point is configured to be cut.

The above display panel further comprises a plurality of second transistors having a first end electrically connected to the corresponding dummy pad, a second end electrically connected to a corresponding DC line, and a gate electrically connected to the first transistors and a gate signal line configured to receive the test starting signal from outside the sealing portion.

In the above display panel, a first one of the first transistors has an end electrically connected to the repair line and a second one of the first transistors has an end isolated from the repair line based on a type of the test signal provided to the defective signal line.

The above display panel further comprises: a repair pad formed outside the sealing portion and connected to the repair line; and a second transistor including a first end electrically connected to the repair pad, a second end overlapping the DC line, and a gate electrically connected to the gate signal line configured to receive the test starting signal from outside the sealing portion.

According to at least one of the disclosed embodiments, even when the data line is disconnected, it is possible to improve display quality.

DETAILED DESCRIPTION OF CERTAIN INVENTIVE EMBODIMENTS

Figure 1:
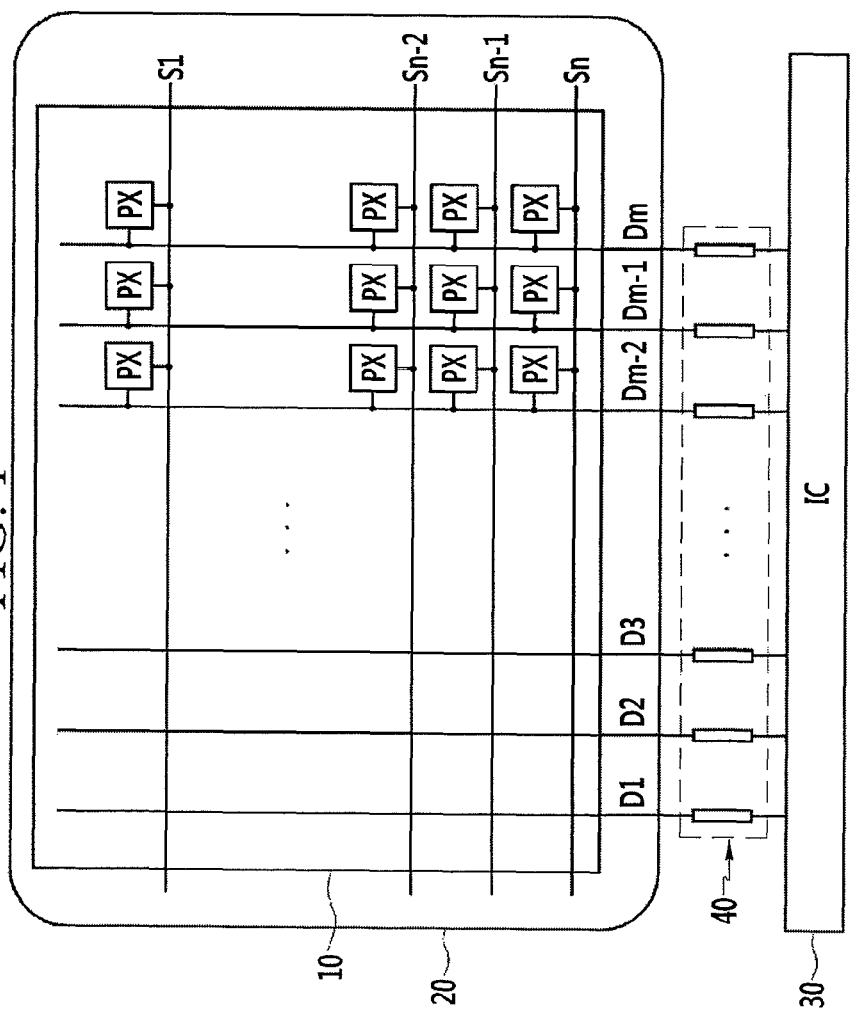
FIG. 1 is a diagram schematically illustrating an OLED display.

In manufacturing a display panel, when the signal wirings or signal lines are broken (due to, e.g., their thinness), the signal is not transferred to the pixel associated with the disconnected signal wiring, and as a result, display quality degrades.

Hereinafter, preferable exemplary embodiment will be described in more detail with reference to the accompanying drawings. Like reference numerals refer to like elements for easy overall understanding and a duplicated description of like elements will be omitted. Further, "module" and "unit" which are suffixes for the components used in the specification are granted or mixed by considering only easiness in preparing the specification and do not have meanings or roles distinguished from each other in themselves. In addition, in describing the exemplary embodiments disclosed in the specification, when it is determined that the detailed description of the publicly known art related to the described technology can obscure the gist of the described technology, the detailed description thereof will be omitted. Further, the accompanying drawings are only for easily understanding the exemplary embodiment disclosed in the specification and the technical spirit disclosed in the specification is not limited by the accompanying drawings and it should appreciated that the accompanying drawings include all changes, equivalents, or substitutions included in the spirit and the technical scope of the described technology.

Terms including an ordinal number such as first or second can be used to describe various components but the components are not limited by the above terms. The above terms are used only to discriminate one component from the other component.

It should be understood that, when it is described that an element is "coupled" or "connected" to another element, the element can be "directly coupled" or "directly connected" to the another element or "coupled" or "connected" to the another element through a third element. In contrast, it should be understood that, when it is described that an element is "directly coupled" or "directly connected" to another element, it is understood that no element is not present between the element and the another element.

A singular form can include a plural form if there is no clearly opposite meaning in the context.

In the present application, it should be understood that term "include" indicates that a feature, a number, a step, an operation, a component, a part or the combination thereof described in the specification is present, but does not exclude a possibility of presence or addition of one or more other features, numbers, steps, operations, components, parts or combinations, in advance.

In a repairing method of a display panel according to an exemplary embodiment, a specific electrode is cut or a plurality of electrodes or layers are connected to each other by using a laser device. However, the described technology is not limited thereto, and various known methods which can be used for cutting or connecting in a manufacturing or repairing process of a general display device can be applied. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a diagram schematically illustrating an OLED display. As illustrated in FIG. 1, in an active area 10 of the display panel, a plurality of data lines D1-Dm and a plurality of scan lines S1-Sn can be formed. The data line transfers a data signal and is formed to be extended in a first direction. The scan line transfers a scan signal and can be formed to be extended in a second direction crossing the first direction.

Further, a pixel PX can be formed to correspond to a region where the scan line and the data line cross each other. Accordingly, a plurality of pixels PX can be formed to correspond to regions where the scan lines and the data lines cross each other.

The pixel PX can be connected with the corresponding scan line. Further, the pixel PX can be connected with the corresponding data line. The pixel PX can include a pixel PX circuit including an OLED configured by a cathode, an anode, and an organic emission layer, and a plurality of thin film transistors and capacitors for driving the OLED.

Next, a sealing part or sealing portion 20 can be formed in a peripheral area of the active area 10. The sealing part 20 can be formed to surround the active area 10. The sealing part 20 can stably couple a substrate and an encapsulation substrate and prevent external air or moisture, and other foreign substances from permeating to the active area 10. The sealing part 20 is formed of vanadium (V) oxide or bismuth (Bi) oxide. Further, the sealing part 20 can be formed of various materials, for example, at least one of TeO2, ZnO, BaO, Nb2O5, SiO2, Al2O3, ZrO2, and P2O5.

In addition, the signal wirings can be connected to a driver IC through a pad part or pad portion 40. The pad part 40 can be formed outside the sealing part 20 surrounding the active area 10. The pad part 40 includes a plurality of pads, and each pad is connected to an end of the corresponding data line.

The driving circuit 30 can transfer a data signal to the pads. A plurality of output lines of the driving circuit 30 is formed between the driving circuit 30 and the pads to connect the driving circuit 30 to the pads.

The data signal which is output from the driving circuit 30 and passes through the pads can be transferred to the pixel PX through the data line. According to the data signal transferred to the pixel PX, a driving current flows through the OLED and thus the OLED emits light.

When the pixel PX of the OLED display configured above has a defect, the corresponding pixel PX can be repaired. Further, when the signal line of the OLED display is disconnected, the disconnected signal line can be repaired.

Generally, a wiring (or line) and a pad for repairing the signal line, and a wiring and a pad for repairing the pixel PX can be formed as one wiring (or line) and one pad. Accordingly, there is a problem in that only one of the signal line or the pixel PX is selectively repaired.

Further, in order to repair the signal line or the pixel PX, a process of short-circuiting or cutting the wiring is performed by using a laser and the like in a pad area outside the sealing part 20. Thereafter, there is a problem where the wiring can corrode.

Hereinafter, a repairing method of a signal line according to exemplary embodiments will be described with reference to FIGS. 2 to 5.

FIGS. 2 to 5 are diagrams illustrating repairing methods of the display panel according to various exemplary embodiments.

Figure 2:
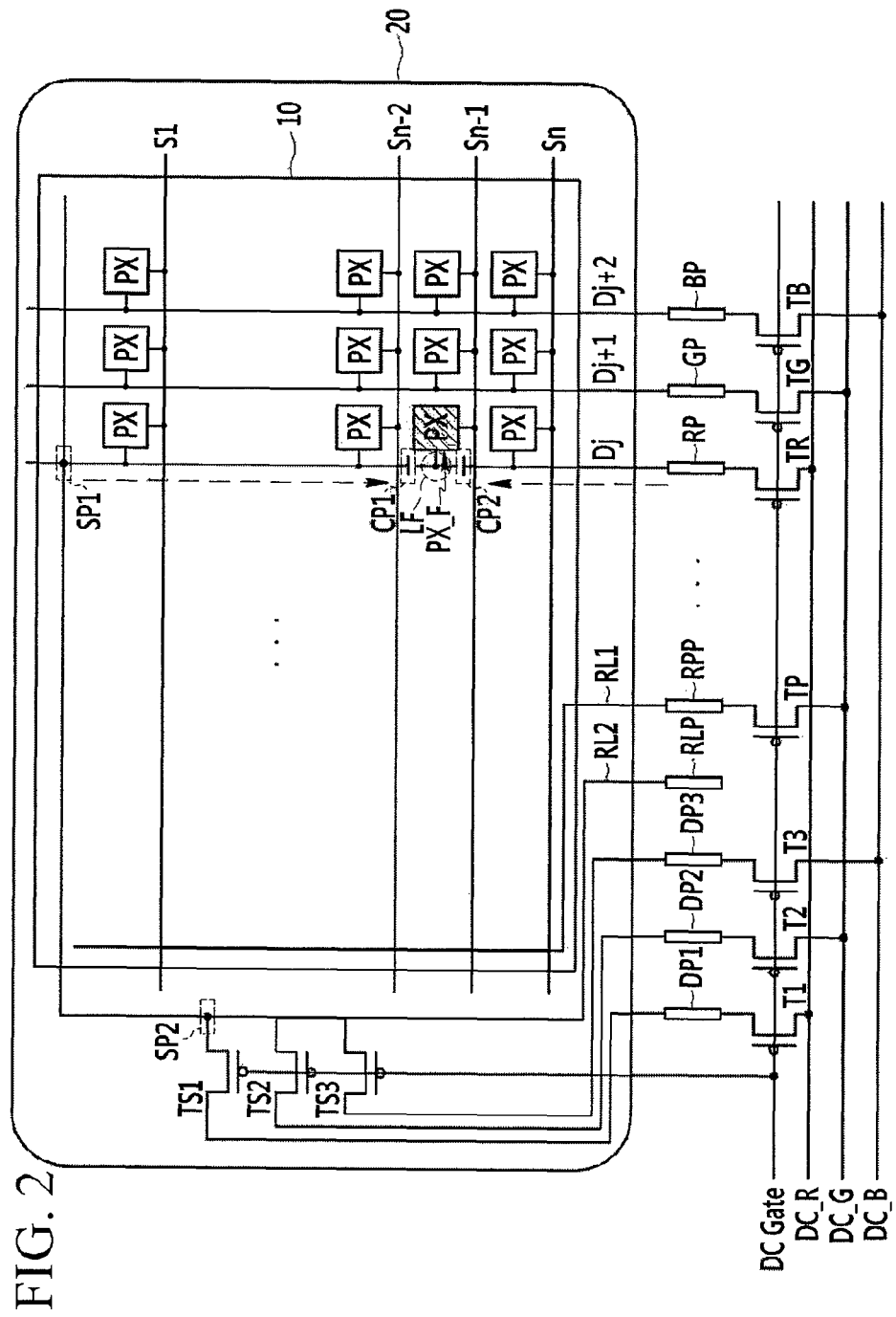
FIGS. 2, 3, 4 and 5 are diagrams illustrating repairing methods of the display panel according to various exemplary embodiments.

As illustrated in FIG. 2, according to a first exemplary embodiment, a wiring or repair line RL2 (hereinafter, described as a repair wiring or repair line RL2) and a pad RLP for repairing signal lines Dj, Dj+1, and Dj+2 and a wiring RL1 and a pad RPP for repairing the pixel PX can be separately configured on the display panel. Further, a plurality of first transistors TS1, TS2, and TS3 in which a gate is connected to a DC gate signal wiring or DC gate signal line or test starting signal line DC GATE can be formed in the sealing part 20. One end of the first transistors TS1, TS2, and TS3 can overlap the repair wiring RL2. One end of the first transistors TS1, TS2, and TS3 overlapping the repair wiring RL2 can be connected to the repair wiring RL2 through a repair process.

Further, the dummy pads DP1, DP2, and DP3 can be connected to any one of a DC_R wiring DC_R supplying R data among RGB data, a DC_G wiring DC_G supplying G data, and a DC_B wiring DC_B supplying B data, respectively. The dummy pads DP1, DP2, and DP3 and each wiring can be connected to each other through a plurality of second transistors T1, T2, and T3 in which a gate is connected to the DC gate signal wiring (or lines) DC GATE. The DC_R, DC_G, and DC_B wirings DC_R, DC_G, and DC_B can also be test signal lines and R, G, B wirings. The DC gate signal wiring can be a gate signal wiring.

In each of the second transistors T1, T2, and T3, a gate is connected to the DC gate signal wiring DC GATE, one end is connected to the corresponding DC_R wiring DC_R, DC_G wiring DC_G, or DC_B wiring DC_B, and the other end can be connected to the corresponding dummy pads DP1, DP2, and DP3. Further, the dummy pads DP1, DP2, and DP3 are connected to the corresponding first transistors TS1, TS2, and TS3, respectively.

Accordingly, the signal transferred through the DC_R wiring DC_R can be transferred to a corresponding first transistor TS1 through the dummy pad DP1 when the corresponding second transistor T1 is turned on by the DC gate signal.

Further, as illustrated in FIG. 1, a plurality of driving pads RP, GP, and BP can be formed outside the sealing part 20. The driving pads RP, GP, and BP can be connected to the corresponding signal lines Dj, Dj+1, and Dj+2. The pixels PX can be connected to the signal lines Dj, Dj+1, and Dj+2, respectively.

Further, the driving pads RP, GP, and BP can be connected to the DC_R wiring DC_R supplying R data among RGB data, the DC_G wiring DC_G supplying G data, and the DC_B wiring DC_B supplying B data. The driving pads RP, GP, and BP and each wiring can be connected to each other through the second transistors TR, TG, and TB which are connected to the DC gate signal wiring DC GATE.

Accordingly, the signal transferred through the DC_R wiring DC_R can be transferred to the corresponding signal line Dj through the driving pad RP when the corresponding second transistor TR is turned on by the DC gate signal.

As illustrated in FIG. 2, when a defect is generated in the signal line Dj corresponding to the DC_R wiring DC_R, the R data may not be transferred to all pixels PX connected to the signal line Dj. For example, in the signal line Dj corresponding to the DC_R wiring DC_R, the R data is not transferred to a pixel PX_F connected to a defect point LF.

A first portion of the signal line Dj is positioned between the defect point LF and the driving pad RP to transfer the R data to the pixel PX. However, the first portion cannot transfer the R data to the pixel PX because of the defect point LF. A second portion of the signal line Dj is positioned between the defect point LF and an overlapping point SP1.

Then, in order to isolate the defect point LF, peripheral points CP1 in the second portion and CP2 in the first portion are cut. The defect point LF is properly isolated so that the signal is normally supplied to a pixel adjacent to the pixel PX_F.

Further, the repair wiring RL2 and the signal line Dj with the defect are connected to each other. In order to short-circuit the repair wiring RL2 and the signal line Dj with the defect together, the repair wiring RL2 and the signal line Dj can be connected to each other by irradiating a laser and the like to the overlapping point SP1 of the repair wiring RL2 and the signal line Dj with the defect.

Next, one end SP2 of the first transistor TS1 corresponding to the DC_R wiring DC_R is connected to the repair wiring RL2. In order to short-circuit the repair wiring RL2 and one end of the first transistors TS1, TS2, and TS3 together, a separate connecting member is formed, and the repair wiring RL2 and one end of the first transistors TS1, TS2, and TS3 can be connected to each other by using a laser and the like.

Then, the R data transferred through the DC_R wiring DC_R can be transferred to the signal line Dj positioned in the second direction from the defect point LF through the turned-on first transistor TS1.

As described above, since the cutting or short-circuiting process is performed by using the laser in the sealing part 20, corrosion of the wiring can be reduced. Further, a repairing process of the signal lines Dj, Dj+1, and Dj+2 can be performed separately from a repairing process of the pixel PX. In addition, the first transistors TS1, TS2, and TS3 are selected according to a kind of data supplied to the signal line with the defect to be connected to the repair wiring RL2.

Figure 3:
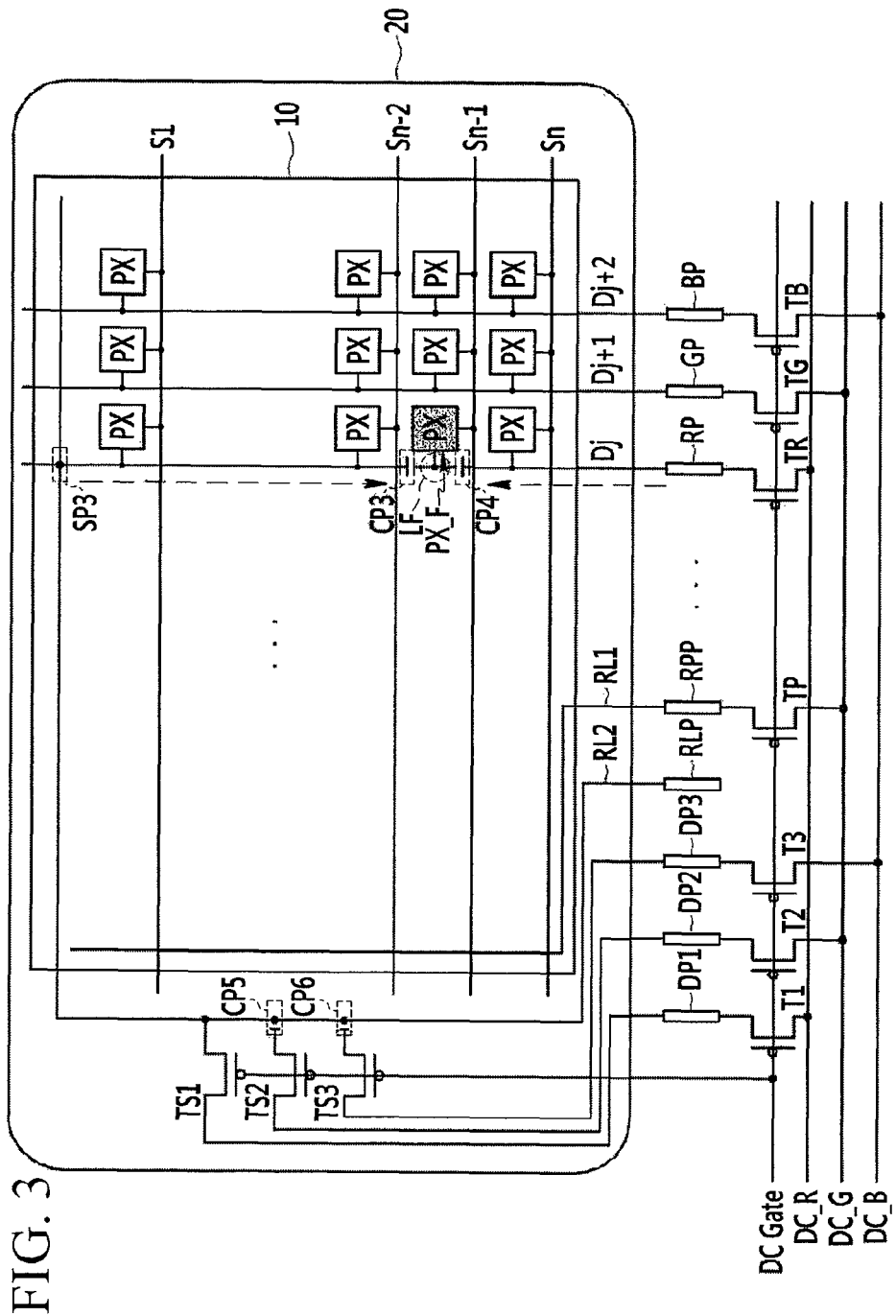

Next, FIG. 3 is a diagram illustrating a repairing method of the display panel according to a second exemplary embodiment.

As illustrated in FIG. 3, according to the second exemplary embodiment, a repair wiring RL2 and a repair pad RLP, and a wiring RL1 and a pad RPP for repairing a pixel PX can be separately configured in the display panel. Further, a plurality of first transistors TS1, TS2, and TS3 in which a gate is connected to a DC gate signal wiring DC GATE can be formed in the sealing part 20. One ends of the first transistors TS1, TS2, and TS3 can be all connected to the repair wiring RL2.

Further, the dummy pads DP1, DP2, and DP3 can be connected to any one of a DC_R wiring DC_R supplying R data among RGB data, a DC_G wiring DC_G supplying G data, and a DC_B wiring DC_B supplying B data. The dummy pads DP1, DP2, and DP3 and each wiring can be connected to each other through a plurality of second transistors T1, T2, and T3 in which a gate is connected to the DC gate signal wiring DC GATE.

In each of the second transistors T1, T2, and T3, a gate is connected to the DC gate signal wiring DC GATE, one end is connected to the corresponding DC_R wiring DC_R, DC_G wiring DC_G, or DC_B wiring DC_B, and the other end can be connected to the corresponding dummy pads DP1, DP2, and DP3. Further, the dummy pads DP1, DP2, and DP3 are connected to the corresponding first transistors TS1, TS2, and TS3, respectively.

Accordingly, the signal transferred through the DC_R wiring DC_R can be transferred to a corresponding first transistor TS1 through the dummy pad DP1 when the corresponding second transistor T1 is turned on by the DC gate signal.

Further, as illustrated in FIG. 1, a plurality of driving pads RP, GP, and BP can be formed outside the sealing part 20. The driving pads RP, GP, and BP can be connected to the corresponding signal lines Dj, Dj+1, and Dj+2. The pixels PX can be connected to the signal lines Dj, Dj+1, and Dj+2, respectively.

Further, the driving pads RP, GP, and BP can be connected to any one of the DC_R wiring DC_R supplying R data among RGB data, the DC_G wiring DC_G supplying G data, and the DC_B wiring DC_B supplying B data. The driving pads RP, GP, and BP and each wiring can be connected to each other through a plurality of second transistors TR, TG, and TB which is connected to the DC gate signal wiring DC GATE.

Accordingly, the signal transferred through the DC_R wiring DC_R can be transferred to the corresponding signal line Dj through the driving pad RP when the corresponding second transistor TR is turned on by the DC gate signal.

As illustrated in FIG. 3, when a defect is generated in the signal line Dj corresponding to the DC_R wiring DC_R, the R data may not be transferred to all pixels PX connected to the signal line Dj in which the defect is generated. For example, a first portion of the signal line Dj is positioned between the defect point LF and the driving pad RP to transfer the R data to the pixel PX. However, due to the defect, the first portion may not transfer the R data to the pixel PX due to the defect point LF. A second portion of the signal line Dj is positioned between the defect point LF and an overlapping point SP3.

Then, in order to isolate the defect point LF, peripheral points CP3 in the second portion and CP4 in the first portion are cut. The defect point LF is properly isolated so that the signal is normally supplied to a pixel adjacent to the pixel PX_F.

Further, the repair wiring RL2 and the signal line Dj with the defect are connected to each other. In order to short-circuit the repair wiring RL2 and the signal line Dj with the defect together, the repair wiring RL2 and the signal line Dj can be connected to each other by irradiating a laser and the like to the overlapping point SP3 of the repair wiring RL2 and the signal line Dj with the defect.

Next, one ends of the first transistors TS2 and TS3 except for the first transistor TS1 corresponding to the DC_R wiring DC_R are isolated from the repair wiring RL2. In order to isolate one end CP5 of the first transistor TS2 corresponding to the DC_G wiring DC_G and the repair wiring RL2, one end CP5 of the first transistor TS2 corresponding to the DC_G wiring DC_G connected to the repair wiring RL2 can be cut by using a laser and the like. In order to isolate one end CP6 of the first transistor TS3 corresponding to the DC_B wiring DC_B and the repair wiring RL2, one end CP6 of the first transistor TS3 corresponding to the DC_B wiring DC_B connected to the repair wiring RL2 can be cut by using a laser and the like.

Then, the R data transferred through the DC_R wiring DC_R can be transferred to the portion positioned between the defect point LF and the overlapping point SP3 through the turned-on first transistor TS1.

As described above, since the cutting or short-circuiting process is performed by using the laser in the sealing part 20, corrosion of the wiring can be reduced. Further, a repairing process of the signal lines Dj, Dj+1, and Dj+2 can be performed separately from a repairing process of the pixel PX. In addition, the connection of the first transistors TS1, TS2, and TS3 and the repair wiring RL2 is maintained according to a kind of data supplied to the signal line Dj with the defect.

Figure 4:
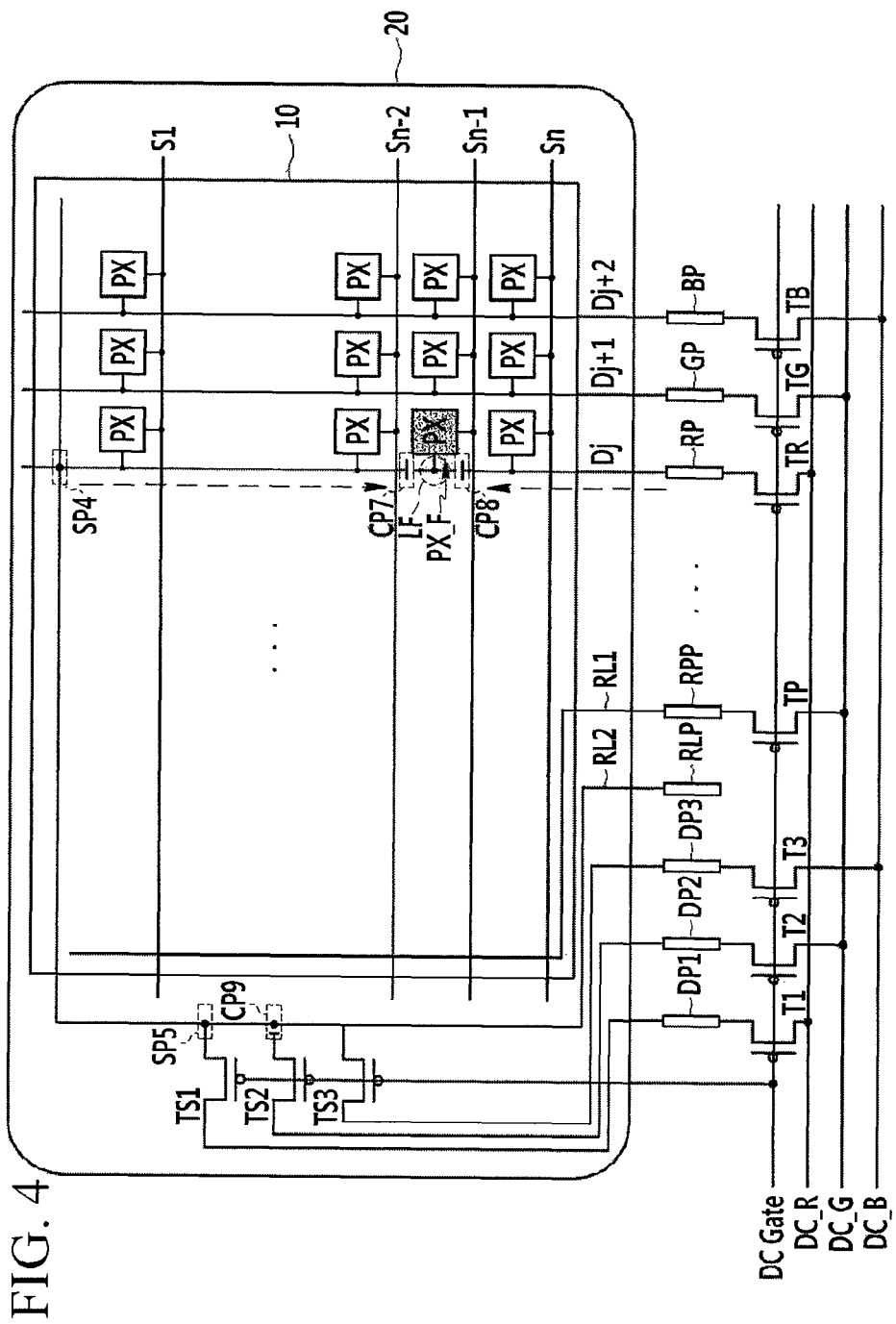

Next, FIG. 4 is a diagram illustrating a repairing method of the display panel according to a third exemplary embodiment.

As illustrated in FIG. 4, according to the third exemplary embodiment, a repair wiring RL2 and a repair pad RLP and a wiring RL1 and a pad RPP for repairing a pixel PX can be separately configured in a display panel. Further, a plurality of first transistors TS1, TS2, and TS3 in which a gate is connected to a DC gate signal wiring DC GATE can be formed in the sealing part 20. One end of at least one of the first transistors TS1, TS2, and TS3 can be connected to the repair wiring RL2.

Further, the dummy pads DP1, DP2, and DP3 can be connected to any one of a DC_R wiring DC_R supplying R data among RGB data, a DC_G wiring DC_G supplying G data, and a DC_B wiring DC_B supplying B data. The dummy pads DP1, DP2, and DP3 and each wiring can be connected to each other through a plurality of second transistors T1, T2, and T3 in which a gate is connected to the DC gate signal wiring DC GATE.

In each of the second transistors T1, T2, and T3, a gate is connected to the DC gate signal wiring DC GATE, one end is connected to the corresponding DC_R wiring DC_R, DC_G wiring DC_G, or DC_B wiring DC_B, and the other end can be connected to the corresponding dummy pads DP1, DP2, and DP3. Further, the dummy pads DP1, DP2, and DP3 are connected to the corresponding first transistors TS1, TS2, and TS3, respectively.

Accordingly, the signal transferred through the DC_R wiring DC_R can be transferred to a corresponding first transistor TS1 through the dummy pad DP1 when the corresponding second transistor T1 is turned on by the DC gate signal.

Further, as illustrated in FIG. 1, a plurality of driving pads RP, GP, and BP can be formed outside the sealing part 20. The driving pads RP, GP, and BP can be connected with the corresponding signal lines Dj, Dj+1, and Dj+2. The pixels PX can be connected to the signal lines Dj, Dj+1, and Dj+2, respectively.

Further, the driving pads RP, GP, and BP can be connected to any one of the DC_R wiring DC_R supplying R data among RGB data, the DC_G wiring DC_G supplying G data, and the DC_B wiring DC_B supplying B data, respectively. The driving pads RP, GP, and BP and each wiring can be connected to each other through a plurality of second transistors TR, TG, and TB which is connected to the DC gate signal wiring DC GATE.

Accordingly, the signal transferred through the DC_R wiring DC_R can be transferred to the corresponding signal line Dj through the driving pad RP when the corresponding second transistor TR is turned on by the DC gate signal.

As illustrated in FIG. 4, when a defect is generated in the signal line Dj corresponding to the DC_R wiring DC_R, the R data may not be transferred to all pixels PX connected to the signal line Dj in which the defect is generated. For example, a first portion of the signal line Dj is positioned between the defect point LF and the driving pad RP to transfer the R data to the pixel PX. However, the first portion may not transfer the R data to the pixel PX because of the defect point LF. A second portion of the signal line Dj is positioned between the defect point LF and an overlapping point SP4.

Then, in order to isolate the defect point LF, peripheral points CP7 in the second portion and CP8 in the first portion are cut. The defect point LF is properly isolated so that the signal is normally supplied to a pixel adjacent to the pixel PX_F connected to the signal line Dj of the defect point LF.

Further, the repair wiring RL2 and the signal line Dj with the defect are connected to each other. In order to short-circuit the repair wiring RL2 and the signal line Dj with the defect together, the repair wiring RL2 and the signal line Dj with the defect can be connected to each other by irradiating a laser and the like to the overlapping point SP4 of the repair wiring RL2 and the signal line Dj with the defect.

Next, one end SP5 of the first transistor TS1 corresponding to the DC_R wiring DC_R is connected to the repair wiring RL2, and one end CP9 of the first transistor TS2 that has been pre-connected to the repair wiring RL2 is isolated from the repair wiring RL2. In order to short-circuit the repair wiring RL2 and one end SP5 of the first transistor TS1, a separate connecting member is formed, and the repair wiring RL2 and one end SP5 of the first transistor TS1 can be connected to each other by using a laser and the like. Further, in order to isolate the one end CP9 from the repair wiring RL2, the one end CP9 can be cut by using a laser and the like.

Then, the R data transferred through the DC_R wiring DC_R can be transferred to the signal line Dj through the turned-on first transistor TS1 and the first portion of the signal line Dj.

As described above, since the cutting or short-circuiting process is performed by using the laser in the sealing part 20, corrosion of the wiring can be reduced. Further, a repairing process of the signal lines Dj, Dj+1, and Dj+2 can be performed separately from a repairing process of the pixel PX. In addition, the connection of the first transistors TS1, TS2, and TS3 and the repair wiring RL2 is maintained according to a kind of data supplied to the signal line Dj with the defect.

Figure 5:
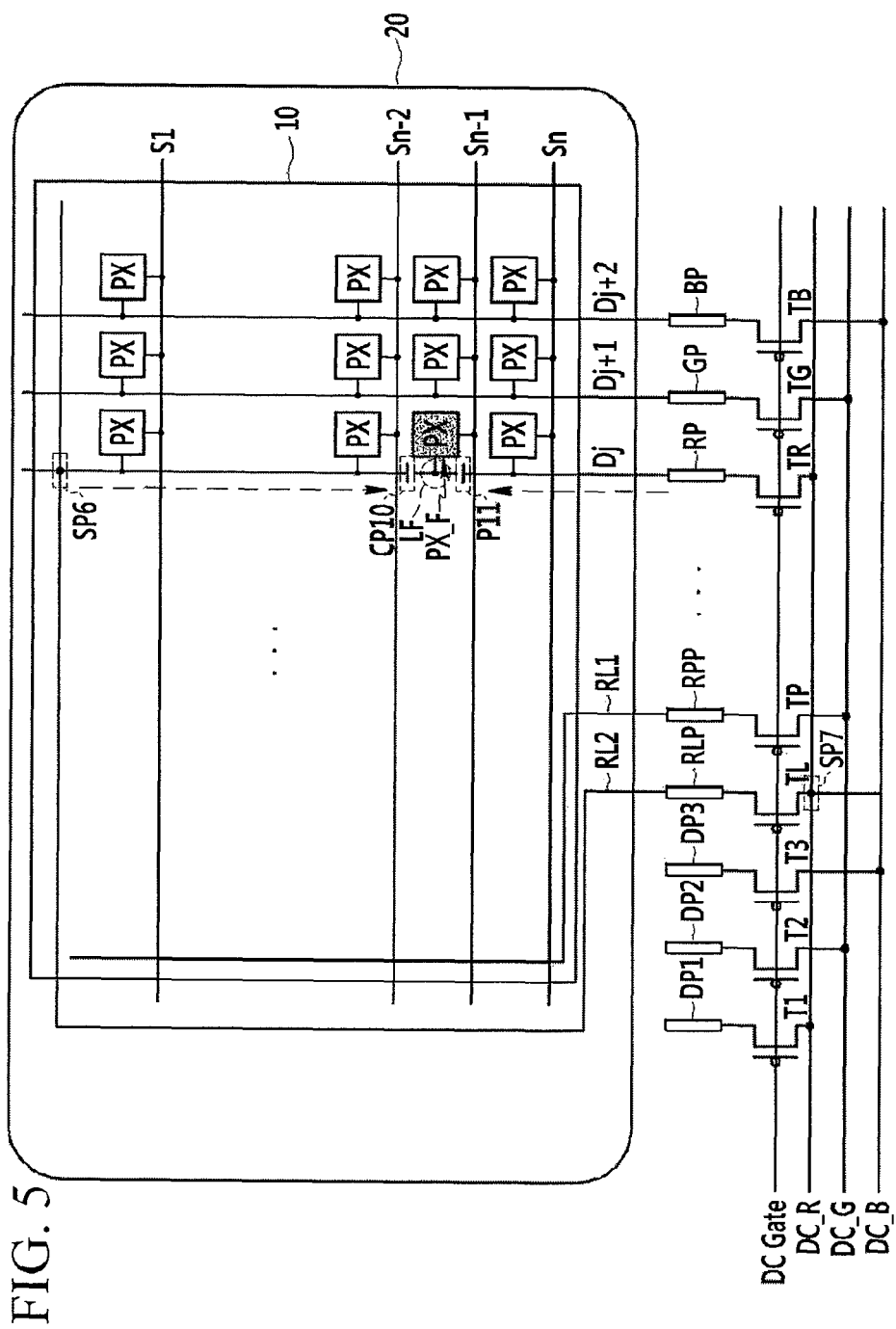

Next, FIG. 5 is a diagram illustrating a repairing method of the display panel according to a fourth exemplary embodiment.

As illustrated in FIG. 5, according to the fourth exemplary embodiment, a repair wiring RL2 and a repair pad RLP and a wiring RL1 and a pad RPP for repairing a pixel PX can be separately configured.

The repair pad RLP connected to the repair wiring RL2 is connected to the second transistor TL. The other end of the second transistor TL of which one end is connected to the repair pad RLP overlaps with all of the DC_R wiring DC_R, the DC_G wiring DC_G, and the DC_B wiring DC_B.

Further, as illustrated in FIG. 1, a plurality of driving pads RP, GP, and BP can be formed outside the sealing part 20. The driving pads RP, GP, and BP can be connected to the corresponding signal lines Dj, Dj+1, and Dj+2. The pixels PX can be connected to the signal lines Dj, Dj+1, and Dj+2, respectively.

Further, the driving pads RP, GP, and BP can be connected to any one of the DC_R wiring DC_R supplying R data among RGB data, the DC_G wiring DC_G supplying G data, and the DC_B wiring DC_B supplying B data. The driving pads RP, GP, and BP and each wiring can be connected to each other through a plurality of second transistors TR, TG, and TB which is connected to the DC gate signal wiring DC GATE.

Accordingly, the signal transferred through the DC_R wiring DC_R can be transferred to the corresponding signal line Dj through the driving pad RP when the corresponding second transistor TR is turned on by the DC gate signal.

As illustrated in FIG. 5, when a defect is generated in the signal line Dj corresponding to the DC_R wiring DC_R, the R data may not be transferred to all pixels PX connected to the signal line Dj in which the defect is generated. For example, a first portion of the signal line Dj is positioned between the defect point LF in the signal line Dj and the driving pad RP to transfer the R data to the pixel PX. However, the first portion may not transfer the R data to the pixel PX because of the defect point LF. A second portion of the signal line Dj is positioned between the defect point LF and an overlapping point SP6.

Then, in order to isolate the defect point LF, peripheral points CP10 in the second portion and CP11 in the first portion are cut. The defect point LF is properly isolated so that the signal is normally supplied to a pixel adjacent to the pixel PX_F connected to the signal line Dj of the defect point LF.

Further, the repair wiring RL2 and the signal line Dj with the defect are connected to each other. In order to short-circuit the repair wiring RL2 and the signal line Dj with the defect, the repair wiring RL2 and the signal line Dj with the defect can be connected to each other by irradiating a laser and the like to the overlapping point SP6 of the repair wiring RL2 and the signal line Dj with the defect.

Next, the other end SP7 of the second transistor TL and the DC_R wiring DC_R are connected to each other. In order to short-circuit the DC_R wiring DC_R and the other end SP7 of the second transistor TL, a separate connecting member is formed, and the DC_R wiring DC_R and the other end SP7 of the second transistor TL can be connected to each other by using a laser and the like.

That is, according to a kind of data supplied to the signal line Dj with the defect, one of the overlapping DC_R wiring DC_R, DC_G wiring DC_G, and DC_B wiring DC_B is selected to be connected to the other end of the second transistor TL.

Then, the R data transferred through the DC_R wiring DC_R can be transferred to the signal line Dj positioned in the second direction from the defect point LF through the turned-on first transistor TS1 and the second portion of the signal line Dj.

As described above, the repairing process of the signal lines Dj, Dj+1, and Dj+2 can be performed separately from the repairing process of the pixel PX. In addition, the other ends of the second transistors T1, T2, and T3 and the DC_RGB wiring are connected to each other according to a kind of data supplied to the signal line Dj with the defect.

The repair process of selecting and connecting the R data, the G data, and the B data are selected according to a kind of data supplied to the signal line Dj with the defect can be performed by the repairing method according to the exemplary embodiment of FIGS. 2 to 5.

Thereafter, when the driving circuit 30 and the display panel are connected to each other, the DC gate signal is supplied at a disable level to turn off the second transistors T1, T2, and T3. Accordingly, the signal supply from the DC_R wiring DC_R, the DC_G wiring DC_G, and the DC_B wiring DC_B to the pads stops. Further, a load of the repair line RL2 can be reduced by turning off the second transistors T1, T2, and T3.

Furthermore, the test signal lines or wirings DC_R, DC_G, DC_B can provide test signals from the driving circuit 30 to the dummy pads DP1-DP3 and the driving pads RP, GP, BP through one of the ends of the second transistors T1-T3, TP, TR, TG, TB. The test signals can be used to test data connections before and after the repairs. Also, the test starting signal line (or DC gate signal wiring DC Gate) can be electrically connected to the the gates of the first transistors TS1-TS3 and the second transistors T1-T3, TP, TR, TG, TB. The test starting signal line can be used to provide test starting signals to the pixels PX from outside the sealing portion 20. The test starting signal can turn on the first and second transistors TS1-TS3 and T1-T3, TP, TR, TG, TB during testing.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel, comprising:
    an active area including a plurality of pixels and a plurality of signal lines;
    a repair line at least partially surrounding the active area and overlapping one of the plurality of signal lines in the active area;
    a plurality of first transistors formed on a side of the active area, wherein one end of each of the first transistors overlaps the repair line;
    a sealing portion configured to seal the active area, the repair line, and the first transistors;
    a pad portion formed outside the sealing portion and including i) a plurality of dummy pads respectively connected to the first transistors and ii) a plurality of driving pads respectively connected to the signal lines; and
    a plurality of test signal lines connected to the corresponding dummy and driving pads and configured to provide test signals from the dummy pads and the driving pads to the pixels.

2. The display panel of claim 1, wherein a defective one of the signal lines is electrically connected to the repair line overlapping the one of the plurality of signal lines.

3. The display panel of claim 2, wherein each of the first transistors is selectively connected to the repair line based on a type of test signal provided to the defective one of the plurality of signal lines.

4. The display panel of claim 2, wherein the defective signal line includes a defect point and a peripheral point adjacent to the defect point, and wherein the peripheral point is configured to be cut.

5. The display panel of claim 1, further comprising a plurality of second transistors each including a first end electrically connected to the corresponding dummy pad, a second end electrically connected to a corresponding test signal line, and a gate electrically connected to the first transistors and a test starting signal line configured to receive a test starting signal from outside the sealing portion.

6. The display panel of claim 1, wherein a first one of the first transistors has an end electrically connected to the repair line, and wherein a second one of the first transistors has an end isolated from the repair line based on a type of test signal provided to a defective one of the signal lines.

7. The display panel of claim 1, further comprising:
    a repair pad formed outside the sealing portion and connected to the repair line; and
    a second transistor including a first end electrically connected to the repair pad, a second end overlapping the test signal lines, and a gate electrically connected to a test starting signal line configured to receive a test starting signal from outside the sealing portion.

8. The display panel of claim 7, wherein one of the test signal lines and the second end of the corresponding second transistor are electrically connected to each other based on a type of test signal supplied to a defective one of the signal lines.

9. A method of repairing a display panel, comprising:
    determining a defective one of a plurality of signal lines, wherein the display panel includes an active area including a plurality of pixels and the signal lines, a repair line at least partially surrounding the active area and overlapping the signal line and the active area, a plurality of first transistors formed on a side of the active area, wherein one end of each of the first transistors overlaps with the repair line;
    cutting a peripheral point adjacent to a defect point indicative of a defect in the defective one of the plurality of signal lines;
    selecting a first transistor of the first transistors based on a type of test signal provided to the defective signal line; and
    connecting the repair line to the selected first transistor based on the type of test signal.

10. The repairing method of claim 9, further comprising supplying a test starting signal at a disable level when the selected first transistor and the repair line are electrically connected to each other,
    wherein the display panel further includes:
        a sealing portion configured to seal the active area, the repair line, and the first transistors;
        a pad portion formed outside the sealing portion and including i) a plurality of dummy pads respectively connected to the first transistors and ii) a plurality of driving pads respectively connected to the signal lines; and
        a plurality of second transistors having a first end electrically connected to a corresponding dummy pad among the dummy pads, a second end electrically connected to a corresponding test signal line, and a gate electrically connected to the selected first transistor and a test starting signal line to which a test starting signal is supplied from outside the sealing portion.

11. The method of claim 9, wherein a first one of the first transistors has an end electrically connected to the repair line, and wherein a second one of the first transistors has an end isolated from the repair line based on a kind of test signal provided to the defective signal line.

12. The method of claim 9, wherein the display panel further comprises:
    a sealing portion configured to seal the active area, the repair line, and the first transistors;
    a pad portion formed outside the sealing portion and including i) a plurality of dummy pads respectively connected to the first transistors and ii) a plurality of driving pads respectively connected to the signal lines;
    a plurality of test signal lines connected to the corresponding dummy and driving pads and configured to provide test signals from the dummy pads and the driving pads to the pixels;
    a repair pad formed outside the sealing portion and connected to the repair line; and
    a second transistor having a first end electrically connected to the repair pad, a second end overlapping the test signal lines, and a gate electrically connected to a test starting signal line configured to receive a test starting signal from outside the sealing portion.

13. The method of claim 12, wherein one of the test signal lines and the second end of the corresponding second transistor are electrically connected to each other based on a kind of test signal supplied to the signal line with the defect.

14. A display panel, comprising:
an active area including a plurality of pixels and a plurality of signal lines electrically connected to the pixels;
a repair line formed at least partially surrounding the active area and overlapping the signal line in the active area;
a plurality of first transistors formed on a side of the active area, wherein one end of each of the first transistors overlaps the repair line at an overlapping point;
a sealing portion configured to seal the active area, the repair line, and the first transistors, wherein the sealing portion surrounds the active area; and
a pad portion formed outside the sealing portion and including i) a plurality of dummy pads respectively connected to the first transistors and ii) a plurality of driving pads respectively connected to the signal lines;
a gate signal line electrically connected to the gates of the first transistors and configured to transmit a test starting signal to the first transistors; and
a direct current (DC) line electrically connected to the signal lines and configured to transmit a test signal and a data signal to the pixels.

15. The display panel of claim 14, wherein a defective one of the signal lines is electrically connected to the overlapping repair line.

16. The display panel of claim 15, wherein the DC line comprises R, G, B lines respectively connected to the corresponding dummy and driving pads, wherein the R, G, B lines are configured to provide the test signal from the dummy and driving pads to the pixels, wherein each of the first transistors is selectively connected to the repair line based on a type of the test signal transmitted to the defective signal line.

17. The display panel of claim 15, wherein the defective signal line includes a defect point and a peripheral point adjacent to the defect point, and wherein the peripheral point is configured to be cut.

18. The display panel of claim 14, further comprising a plurality of second transistors having a first end electrically connected to the corresponding dummy pad, a second end electrically connected to a corresponding DC line, and a gate electrically connected to the first transistors and a gate signal line configured to receive the test starting signal from outside the sealing portion.

19. The display panel of claim 14, wherein a first one of the first transistors has an end electrically connected to the repair line and a second one of the first transistors has an end isolated from the repair line based on a type of the test signal provided to the defective signal line.

20. The display panel of claim 14, further comprising:
a repair pad formed outside the sealing portion and connected to the repair line; and
a second transistor including a first end electrically connected to the repair pad, a second end overlapping the DC line, and a gate electrically connected to the gate signal line configured to receive the test starting signal from outside the sealing portion.

* * * * *